United States Patent [19]
Ueba et al.

[11] Patent Number: 5,229,845
[45] Date of Patent: Jul. 20, 1993

[54] ELECTROCONDUCTIVE THIN FILM OF ORGANIC CHARGE TRANSFER COMPLEXES OF BISETHYLENEDITHIATETRATHIAFULVALENE

[75] Inventors: Yoshinobu Ueba; Takayuki Mishima; Hiroyuki Kusuhara, all of Osaka, Japan

[73] Assignee: Sumitomo Electric Industries, Ltd., Osaka, Japan

[21] Appl. No.: 543,872

[22] Filed: Jun. 26, 1990

[30] Foreign Application Priority Data

| Jun. 26, 1989 | [JP] | Japan | 1-160632 |
| Aug. 23, 1989 | [JP] | Japan | 1-214951 |
| Dec. 11, 1989 | [JP] | Japan | 1-320976 |
| Mar. 31, 1990 | [JP] | Japan | 2-87228 |
| May 10, 1990 | [JP] | Japan | 2-118596 |

[51] Int. Cl.$^5$ ............... H01L 29/28; H01L 39/22; H01L 27/12
[52] U.S. Cl. ............ 257/40; 502/158; 505/802; 257/9; 257/31
[58] Field of Search ......... 502/158; 505/802; 357/4, 5, 8

[56] References Cited

U.S. PATENT DOCUMENTS

| 4,578,220 | 3/1986 | Huenig et al. | 502/158 |
| 4,632,776 | 12/1986 | Williams et al. | 505/802 |
| 4,675,415 | 6/1987 | Williams et al. | 549/3 |
| 4,691,028 | 9/1987 | Inokuchi et al. | 549/36 |

FOREIGN PATENT DOCUMENTS

| 61-077322 | 4/1986 | Japan |
| 62-295031 | 12/1987 | Japan |
| 63-292138 | 11/1988 | Japan |
| 63-293549 | 11/1988 | Japan |
| 1-289013 | 11/1989 | Japan |
| 2-114574 | 4/1990 | Japan |

OTHER PUBLICATIONS

Kini et al. "(MDT-TTF)$_2$AuI$_2$: An Ambient Pressure Organic Superconductor ($T_c$=4.5 K) Based on an Unsymmetrical Electron Donor" *Solid State Comm.* vol. 69(5) Jun. 14, 1989 pp. 503–507.

Schweitzer et al. "Superconductivity in Polycrystalline Pressed Samples of Organic Metals" *Solid State Comm.* vol. 69(8) Jun. 14, 1989 pp. 843–845.

Gorkov "The Type of Superconductivity in Bechgaard's salts" *JETP Lett.* vol. 44 No. 11 Dec. 10, 1986 pp. 693–696.

Physica C. vol. 156, No. 1, Aug. 1, 1988, Amsterdam NL pp. 173–175; H. H. Wang et al: "ESR Studies of the 10.4 K Ambient-Pressure Organic Superconductor k-(BEDT-TTF)$_2$Cu(NCS)$_2$" * abstract*, *introduction*.

Journal of Molecular Electronics. Jan./Mar. 1989 vol. 5, No. 1, Chichester GB pp. 25–32; E. B. Yagubskii et al: "Organic Conductors and Superconductors Based on Bis(ethylenedthio)tetrathiafulvalene and its Derivatives".

*Primary Examiner*—Andrew J. James
*Assistant Examiner*—Ngan Van Ngo
*Attorney, Agent, or Firm*—Cushman, Darby & Cushman

[57] ABSTRACT

An organic thin film and process for making the same, having electroconductivity, semiconductivity or superconductivity. The film is made of vapor-deposited bisethylenedithiatetrathiafulvalene (BEDT-TTF) by heating BEDT-TTF at a pressure of $10^{-2}$ Torr or below and at a temperature not higher than 260° C. The temperature of the substrate on which the vapor is deposited is held at a lower temperature than the vapor. A thin film produced under these temperature and pressure conditions contains substantially no decomposition product. The electroconductivity of the film can be adjusted by selecting the substrate used for vapor-deposition of the film and the electron acceptor used as a dopant of the film. In order to achieve a vapor-deposited film with a high degree of orientation, silicon wafer is preferably used as a substrate for the film.

3 Claims, 9 Drawing Sheets

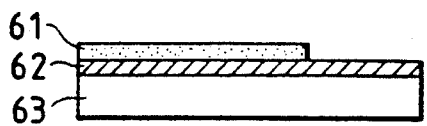
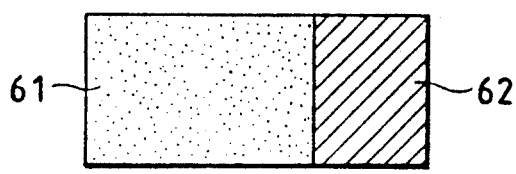
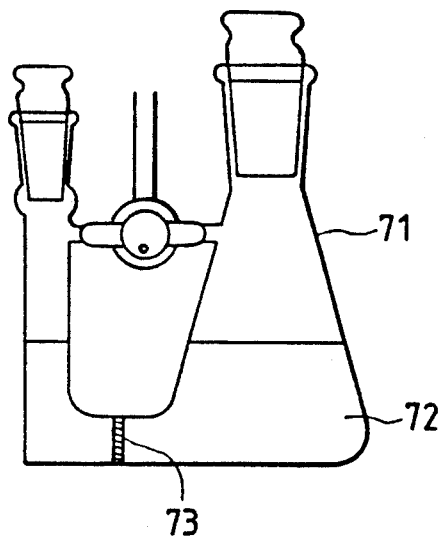
FIG. 7
FIG. 8
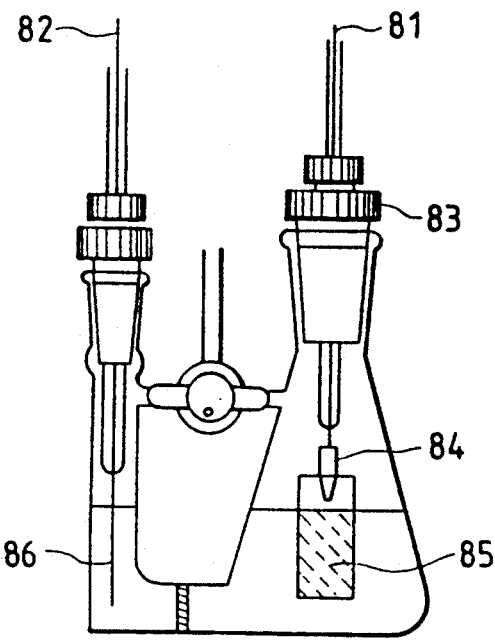

ELECTROCONDUCTIVE THIN FILM OF ORGANIC CHARGE TRANSFER COMPLEXES OF BISETHYLENEDITHIATETRATHIAFULVALENE

BACKGROUND OF THE INVENTION

1. Field of the Industrial Utility

The present invention relates to an organic film having semiconductivity, electroconductivity or even superconductivity. More particularly, the present invention relates to an electroconductive organic thin film made of a vapor-deposited bisethylene dithiatetrathiafulvalene (BEDT-TTF) film doped with an electron acceptor, as well as a process for producing such an organic thin film.

Further, the present invention relates to a vapor-deposited BEDT-TTF film that can be used as an electroconductive organic thin film, as well as a process for producing such vapor-deposited film.

2. Description of Related Art

Organic thin films can be produced by various techniques such as a Langmuir-Blodgett (LB) method, vapor deposition, an ionized cluster beam (ICB) method and a molecular beam epitaxy (MBE) method. Using these methods, semiconductive or electroconductive organic thin films have been prepared from tetrathiofulvalene (TCNQ), tetrathiofluvalene-tetracyanoquinodimethane (TTF-TCNQ), metalphthalocyanine, etc., and insulator films form aliphatic acids, etc.

Because of their nature as electric conductors or semiconductors, organic thin films having electroconductivity have potential use in electronics, opto-electronics, energy conversion and other fields of application. In particular, organic thin films having high conductivity hold promise for use in many applications including micro-wiring, striplines, sensors, display devices, memories and switching devices. However, no organic thin films that have high electroconductivity like metals are yet to be realized.

It has recently been proposed that an organic semiconductor or conductor film be prepared by a process that includes the steps of forming a film of an electron-donating organic compound such as a fulvalene containing a chalcogen atom in the molecule on an electrode substrate, and oxidizing said film by electrolysis (Unexamined Published Japanese Patent Application No. 289013/1989). According to a specific example disclosed in this prior patent, BEDT-TTF as an electron-donating organic compound was vacuum-deposited on a platinum-evaporated glass substrate, and gold was vacuum-deposited on the resulting BEDT-TTF film to form an electrode, and subsequently, the electrode was electrolytically oxidized with tetraethyl ammonium perchlorate used as an electrolyte, whereby a film having conductivity of $3 \times 10^{-3}$ S/cm was obtained.

However, this organic thin film and all others that are produced by the conventional methods have conductivity lower than that of metals. Further, the temperature dependency of the conductivity of prior art conductive organic thin films does not show a metallic behavior.

Another problem with the prior art is that the melting point and the decomposition point of BEDT-TTF are so close to each other that it is extremely difficult to vaporize BEDT-TTF without generating decomposition products. If it were possible to prepare a vapor-deposited BEDT-TTF containing no decomposition products, an organic thin film having high conductivity could be produced by doping said BEDT-TTF film with an electron acceptor. However, no method has so far been proposed that is directed to forming a vapor-deposited BEDT-TTF film having such high quality and purity. Accordingly, there has been no report published on the possibility of using the vapor-deposited BEDT-TTF film to make an organic thin film that shows high conductivity or even superconductivity.

SUMMARY OF THE INVENTION

It is, therefore, an object of the present invention to provide an organic thin film having semiconductivity and electroconductivity, in particular, an organic thin film that shows high or metal-like conductivity and even superconductivity.

Another object of the present invention is to provide a vapor-deposited BEDT-TTF film of high purity in which the generation of decomposition products is prevented or minimized. The structure of BEDT-TTF is given below as structure (I):

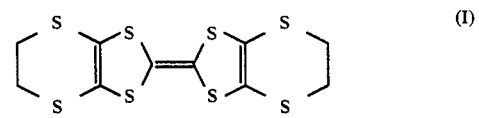

As a result of the intensive studies conducted to attain these objects, the present inventors found that a BEDT-TTF film could be formed on a substrate by heating BEDT-TTF at a temperature of up to 260° C. in vacuo ($10^{-2}$ to $10^{-3}$ Torr or even below) and that an electroconductive organic thin film could be obtained by doping the resulting vapor-deposited BEDT-TTF film with an electron acceptor.

It has hitherto been held that the boiling point and the decomposition temperature of BEDT-TTF are so close to each other that upon heating, it hardly vaporizes but will simply decompose. However, to one's surprise, if BEDT-TTF is vapor-deposited in vacuo at a temperature not higher than 260° C. which is the decomposition point as determined from thermogravimetric (TG)-differential thermal analysis (DTA), preferably at a low temperature of 250° C. or below, a satisfactory thin film of BEDT-TTF can be formed on a substrate without letting the BEDT-TTF decompose. Further, a vapor-deposited BEDT-TTF film that does not contain any decomposition product can be efficiently formed on a substrate in a tubular vapor-depositing vessel with a temperature gradient being created along the tube wall.

While various conductive substrates can be employed, the present inventors found that a dense BEDT-TTF film having a high degree or orientation and that the major axes of the fine crystals of BEDT-TTF oriented perpendicular to the substrate surface could be obtained by using a silicon substrate.

Further, by combining this film forming step with the step of doping with an electron acceptor, an organic thin film having semiconductivity or electroconductivity or even superconductivity can be obtained, if the doping method, the dopant concentration and the dopant type are properly selected.

The present invention has been accomplished on the basis of these findings.

Thus, in accordance with the present invention, there is provided an electroconductive organic thin film that is made of a vapor-deposited bipethylenedithiatetrathiafulvalene (BEDT-TTF) film doped with an electron acceptor.

Also provided in accordance with the present invention is a process for producing an electroconductive organic thin film, which process comprises the steps of heating/BEDT-TTF to a predetermined temperature of up to 260° C. under vacuum, forming a BEDT-TTF film on a substrate held at a temperature less than the temperature to which said BEDT-TTF is heated, and doping the BEDT-TTF film with an electron acceptor.

Further, in accordance with the present invention, there are provided a process for producing a vapor-deposited BEDT-TTF film, which process comprises the steps of heating BEDT-TTF to a predetermined temperature of up to 260° C. under vacuum, and forming a BEDT-TTF film on a substrate held at a temperature less than the temperature to which said BEDT-TTF is heated, as well as the vapor deposited BEDT-TTF film formed by said process.

Other objects, features and characteristics of the present invention, as well as the methods of operation and function of the related elements of the structure, and the combination of parts and economies of manufacture, will become more apparent upon consideration of the following detailed description and the appended claims with reference to the accompanying drawings all of which form a part of this specification.

BRIEF DESCRIPTION OF THE DRAWINGS

FIGS. 6a and 6b show a cross section of an electroconductive substrate having a vapor-deposited BEDT-TTF film formed thereon;

FIG. 7 is a schematic diagram of a reactor for preparing an electrolytic solution containing an electron acceptor;

FIG. 8 is a schematic diagram of an apparatus for performing doping with an electron acceptor by an electrolytic method;

DETAILED DESCRIPTION OF THE PREFERRED EMBODIMENT

According to the general procedure of vacuum deposition, a sample in a vacuum enclosure held in high vacuum is heated to vaporize and its molecules are allowed to condense without involving any chemical reaction to form a vapor-deposited film on a substrate held at a predetermined temperature. Because of its operating principle, vacuum deposition is applied to materials that are solid at ordinary temperatures and pressures and that will not decompose upon heating.

Figure 1:
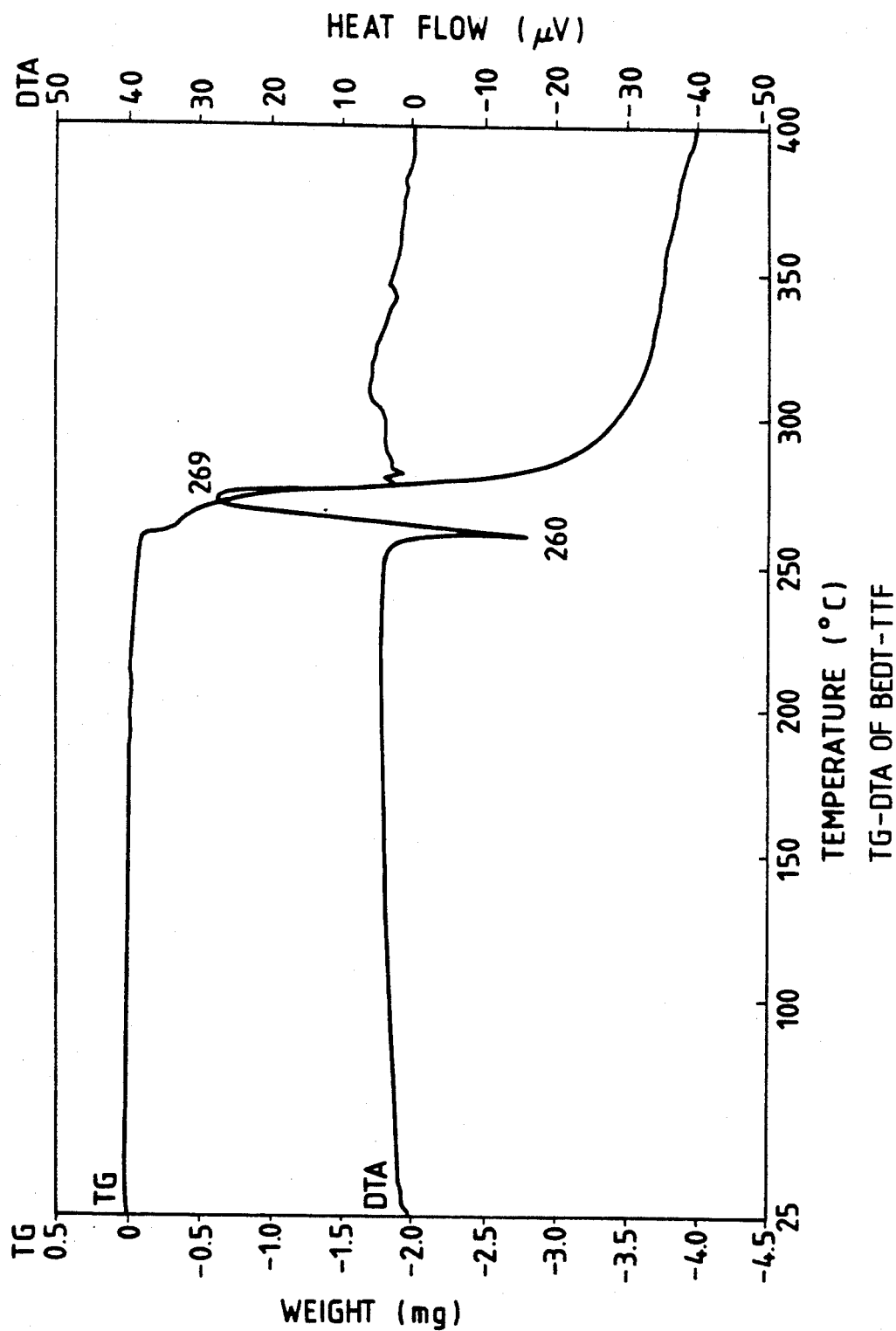
FIG. 1 is TG-DTA spectra of BEDT-TTF.

As is apparent from the results of thermogravimetric (TG)-differential thermal analysis (DTA) shown in FIG. 1, it has been held that BEDT-TTF has a boiling point (Tm = 258° C.) and a decomposition temperature (260° C.) which are so close to each other that upon heating it hardly vaporizes but will simply decompose. As a matter of fact, if one attempts to form a vapor-deposited BEDT-TTF film on a substrate by the usual vacuum deposition technique, a volatile decomposition product will be generated and incorporated in the resulting vapor-deposited film. Even if such a film is doped with an electron acceptor, no practical conductive film can be formed.

However, to one's surprise, if BEDT-TTF is heated under vacuum from room temperature to a predetermined temperature of up to 260° C. and if a BEDT-TTF film is formed on a substrate held at a temperature lower than the temperature to which the BEDT-TTF is heated, a vapor-deposited BEDT-TTF film with a reduced content of the decomposition product can be obtained.

In accordance with the present invention, a thin BEDT-TTF film can be formed with an ordinary thermal deposition apparatus, preferably a tubular vessel, by a vacuum deposition method or MBE method in which the thin-film forming material is heated to vaporize in high vacuum and the vapor is condensed on a substrate to form a thin film.

Stated more specifically, BEDT-TTF is heated in vacuo at a pressure of $10^{-2}$ Torr or below, preferably at $10^{-3}$ to $10^{-10}$ Torr, more preferably in high vacuum at a pressure of $10^{-5}$ to $10^{-10}$ Torr, and at a temperature of up to 260° C., preferably between 180° and 250° C., whereby a vapor-deposited BEDT-TTF film is formed on a substrate.

If the heating temperature exceeds 260° C., BEDT-TTF will decompose. The temperature at which the starting BEDT-TTF is heated can be made lower than 260° C. by reducing the pressure in the system below $10^{-5}$ Torr. For instance, if vapor deposition is performed in a high-vacuum atmosphere at a pressure of about $10^{-10}$ Torr, the temperature at which the starting BEDT-TTF is heated can be lowered to about 180°-200° C.

Further, a vapor-deposited BEDT-TTF film containing no decomposition products can be obtained efficiently by carrying out the above-described procedure in a tubular vapor-depositing vessel, with a temperature gradient being created along the tube wall.

Figure 2:
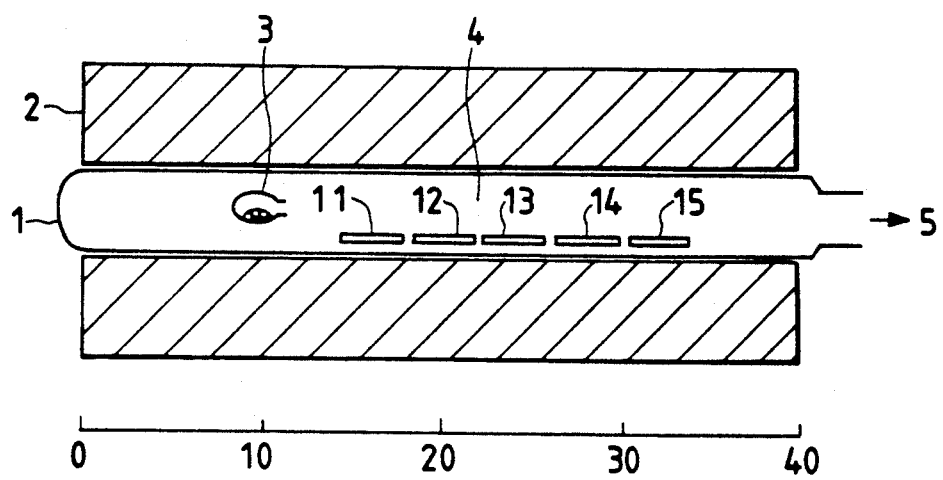
FIG. 2 is a schematic cross-sectional view of an apparatus that is used to form a vapor-deposited BEDT-TTF film on substrates.

As shown specifically in FIG. 2, the fine crystals or powder of BEDT-TTF in a feed cell 3 is put into a tubular vapor-depositing vessel (vacuum enclosure) 1. Substances 1–5 are placed in the vessel 1 along the length of the tube wall at given distances from the feed cell 3. The vessel 1 is set horizontally within a tubular furnace 2.

After evacuating the vessel, the feed cell is heated to a predetermined temperature less than 260° C. and held at that temperature for a given period. The thickness of vapor-deposited film can be adjusted by controlling such factors as the distance between the feed cell and each substrate, the temperature to which the feed cell is heated, the time for which said temperature is maintained, and the degree of vacuum.

The distance between the feed cell and each substrate and the temperature at which the substrates are heated are two important factors for obtaining a vapor-deposited BEDT-TTF film of good quality that does not contain decomposition products. If the distance between the feed cell and each of the substrates increases to lower the substrate temperature, a yellow decomposition product is likely to be deposited on the substrates. A vapor-deposited BEDT-TTF film of good quality has a red to orange color and can be readily identified with the eye.

Figure 3:
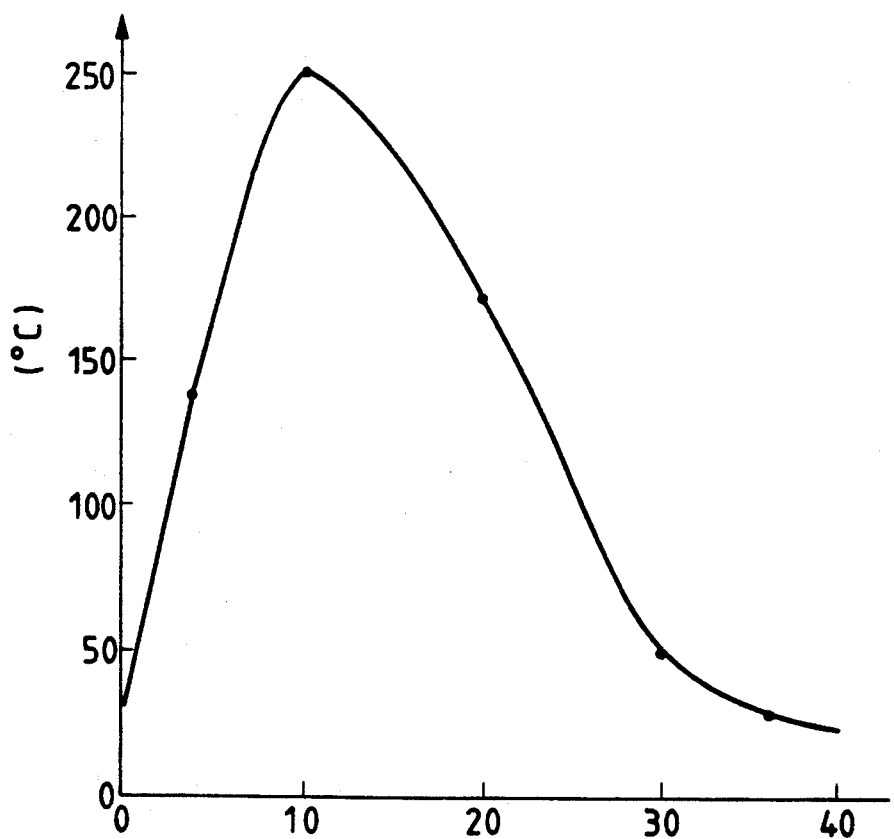
FIG. 3 is a diagram showing the temperature profile along the wall of the quartz tube in the vapor-deposited film forming apparatus shown in FIG. 2.

Therefore, vapor-deposited BEDT-TTF film of good quality can be efficiently produced if the distance to each substrate and the substrate temperature that insure the formation of an orange-colored vapor-deposited film are determined by preliminary testing with the apparatus shown in FIG. 2 in connection with the temperature at which the feed cell is heated and the temperature gradient along the wall of the tubular vessel. FIG. 3 shows a typical temperature profile along the wall of the quartz tube in the vapor-deposited film forming apparatus shown in FIG. 2, and one can see from this graph that under the conditions of vapor deposition used in Example 1 to be described below, an orange-colored thin film of good quality that did not contain decomposition products could be formed on substrates 1-3 which were placed at distances in the range of 5-15 cm from the feed cell.

There is no particular limitation on the substrate that can be used in the present invention and illustrative examples include substrates made of ITO glass, NESA glass, silicon, electroconductive polymer films or thin films, conductive LB films, carbon, graphite, etc. Among these, silicon substrates (silicon wafers) made of (100) silicon (n- or p-type) and (111) silicon (n- or p-type) are preferred since, their use is effective in producing a vapor-deposited film characterized by a significant improvement in the orientation of the BEDT-TTF crystals.

Figure 5:
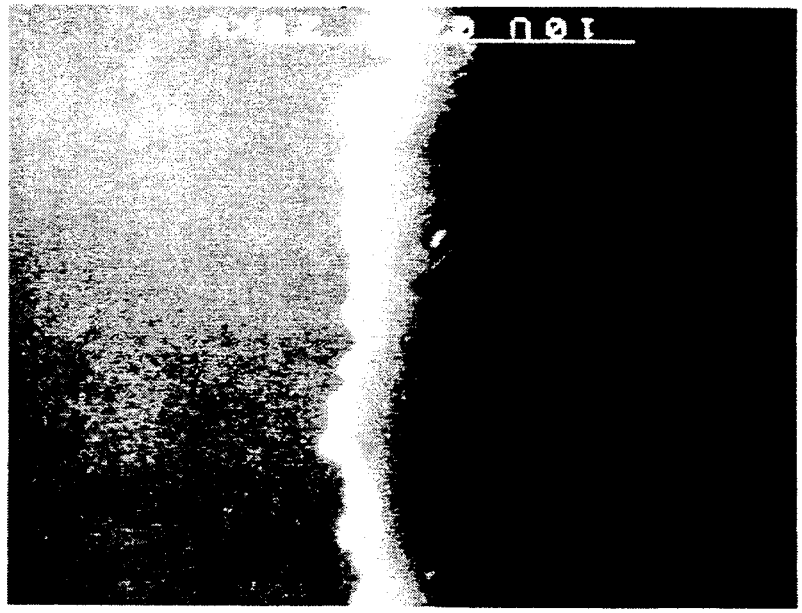
FIG. 5 is a SEM picture of a cross section of the vapor-deposited BEDT-TTF film formed on an indium oxide coated glass substrate in Example 3, and it shows the crystalline structure of that film (see the central white layer), with the substrate shown as the lower layer and the white line on the right side representing a scale equivalent to 10 $\mu$m in length.

Vapor-deposited BEDT-TTF films are usually obtained as films in which the micro crystallites of BEDT-TTF are randomly oriented and agglomerated, and even if they are oxidized or doped electrolytically, the molecular orientation in the crystal still remains random and the failure to achieve high conductivity causes substantial difficulty in obtaining a superconductive film having small residual resistance. FIG. 5 is a scanning electron microscopic (SEM) picture of a cross section of vapor-deposited BEDT-TTF film formed on an indium oxide coated glass substrate, and it clearly shows the tendency of random orientation in the crystalline structure of the film.

Figure 4:
FIG. 4 is a scanning electron microscopic (SEM) picture of a cross section of the vapor-deposited BEDT-TTF film formed on an n-type silicon (100) substrate in Example 2, and it shows the crystalline structure of that film (see the central white layer), with the substrate shown as the lower layer and the white line on the right side representing a scale equivalent to 10 $\mu$m in length.

It was found that the orientation of the BEDT-TTF crystallites was markedly improved when a silicon wafer was used as the substrate compared to when oxide conductor coated glass substrates such as ITO glass and NESA glass were used. It was also found that the vapor-deposited BEDT-TTF film prepared with a silicon wafer used as a substrate had the major axes of the micro crystallites of BEDT-TTF oriented perpendicular to the substrate surface. FIG. 4 is a SEM picture of a cross section of a vapor-deposited BEDT-TTF film formed on a silicon wafer substrate, and the film is obviously a dense film having the major axes of the fine crystals of BEDT-TTF oriented perpendicular to the substrate surface. The thus obtained vapor-deposited BEDT-TTF film having a high degree of orientation is morphologically preferred for doping with an electron acceptor.

The vapor-deposited BEDT-TTF film produced by the process of the present invention is an insulator per se but an electroconductive or even superconducting organic thin film can be obtained if this BEDT-TTf film is doped with an electron acceptor by a suitable method such as a vapor-phase method, a liquid-phase method, an electrochemical method or an ion-implantation method.

The process for producing an electroconductive organic thin film in accordance with the present invention comprises the following two basic steps:
(1) heating BEDT-TTF in vacuo at a pressure of $10^{-2}$ Torr or below at a temperature not higher than 260° C. so as to form a vapor-deposited BEDT-TTF film on a substrate; and
(2) doping the vapor-deposited BEDT-TTF film with an electron acceptor.

Steps (1) and (2) are usually performed consecutively but if the doping method adopted permits, an electron acceptor may be doped as the vapor-deposited film is formed.

Examples of the electron acceptor that may be used in the present invention include: trihalide anions such as $I_3^-$, $Br_3^-$, $IBr_2^-$, $ICl_2^-$ and $I_2Br^-$ that are represented by $X_3^-$ (X is a halogen atom); anions that are represented by $MX_2^-$ (M is a metal atom; and X is a halogen atom or a pseudo halide such as $AuI_2^-$, $AuIBr^-$, $AuBr_2^-$, $Cu(NCS)_2^-$, $Ag(NCS)_2^-$, $Au(NCS)_2^-$, $Cu(NCSe)_2^-$, $Cu(NCO)_2^-$ and $Au(CN)_2$; and other anions such as $NO_3^-$, $BF_4^-$, $ClO_4^-$, $ReO_4^-$ and $PF_4^-$. Among these anions, $X_3^-$ and $MX_2^-$ are particularly preferred for the purpose of obtaining an organic superconducting thin film.

By doping the vapor-deposited BEDT-TTF film with these electron acceptors, an organic thin film that shows conductivity or superconductivity can be obtained.

While electron acceptors can be doped by various methods including an electrochemical method and a vapor-phase method, the use of an electrochemical method is preferred. Doping by an electrochemical method can be performed in the usual manner with a known electrochemical crystallizing apparatus.

FIGS. 6a and 6b show a vapor-deposited BEDT-TTF film 61 that is produced on a substrate made of an indium oxide layer 62 coated on glass 63. This vapor-deposited BEDT-TTF film can advantageously be doped with an electron acceptor by an electrochemical method using a reactor 71 (see FIG. 7) for preparing an electron acceptor containing electrolytic solution 72 and a reactor (see FIG. 8) for performing doping with an electron acceptor. In the reactor shown in FIG. 8, an electroconductive substrate 85 having a vapor-deposited thin BEDT-TTF film is retained on the anode side and a platinum plate 86 is used as cathode, with the liquid electrolyte being a supporting electrolyte that contains one or more of the anions listed above an which is dissolved in an organic solvent solution that has strong polarity and that is resistant to oxidation and reduction. Electroconductivity can be adjusted by properly selecting the type of anion and the degree of doping.

No report has heretofore been published on the preparation of vapor-deposited BEDT-TTF films of high quality that are free from the generation of decomposition products. This is because it has been held that BEDT-TTF has a melting point and a decomposition temperature that are so close to each other that it cannot be vaporized without decomposition. However, a satisfactory thin BEDT-TTF film can be formed on a substrate by heating BEDT-TTF in vacuo at a temperature of up to 260° C. In this case, a vapor-deposited BEDT-TTF film having a high degree of orientation can be obtained by using a silicon substrate.

Further, by properly selecting process parameters such as the type of electron acceptor used as a dopant, the electroconductivity of the thin film to be obtained can be adjusted in such a way as to produce a conductive organic thin film that shows metal-like properties.

EXAMPLES

The following examples are provided for the purpose of further illustrating the present invention but are in no way to be taken as limiting.

EXAMPLE 1

Five glass plates (10×20×1 mm) coated with indium oxide ($In_2O_3$) were used as substrates for depositing a thin BEDT-TTF film on each of these substrates by the following procedure.

As shown in FIG. 2, a feed cell 3 charged with 50 mg of a BEDT-TTF powder and the five $In_2O_3$ coated glass substrates 1-5 were placed in a quartz reaction tube 1, which in turn was set in a two-zone tubular furnace 2. The quartz tube was evacuated with a vacuum pump capable of attaining an ultimate pressure of $10^{-5}$ Torr. The feed cell was heated from room temperature to 250° C. and held at 250° C. for 30 min. The resulting temperature profile in the area of the reaction tube where the substrates were placed was as shown in FIG. 3.

Figure 9:
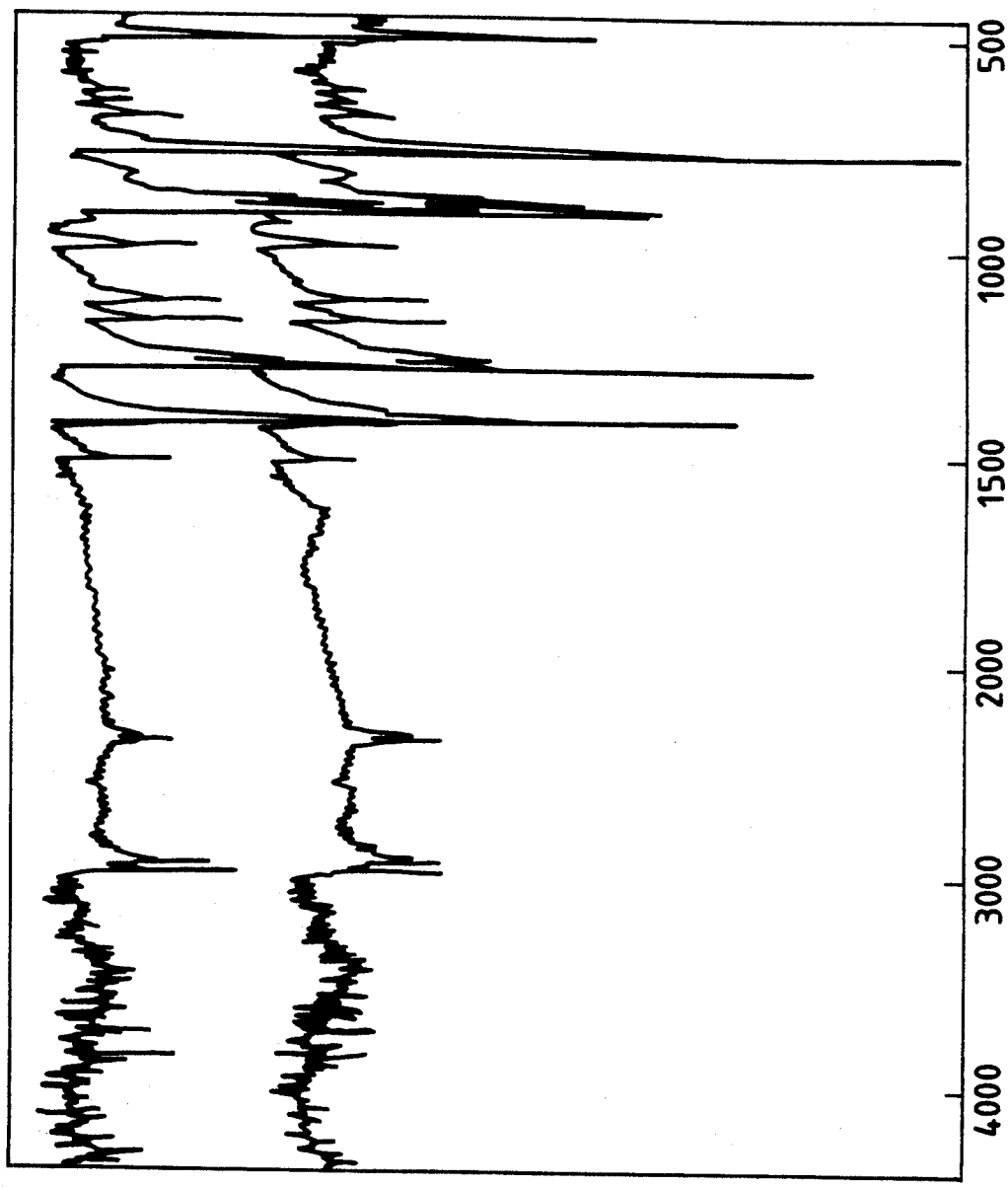
FIG. 9 is the FTIR spectra of a starting BEDT-TTF powder and a vapor-deposited BEDT-TTF film.

After cooling the tubular furnace 2 to room temperature, the quartz tube was taken out of the furnace and checked for the color and morphology of the vapor-deposited film on each of the substrates. An orange-colored thin film of good quality that did not contain decomposition products was obtained on substrates 1-3 that were placed at distances in the range of 5-15 cm from the feed cell, whereas a yellow thin film containing decomposition products was obtained on substrates 4 and 5 that were placed at distances in the range of from 15 to 20 cm from the feed cell. Since the FTIR spectrum of each orange-colored vapor-deposited film was in agreement with that of the starting BEDT-TTF powder as shown in FIG. 9, this film was identified as being composed of BEDT-TTF.

Figure 10:
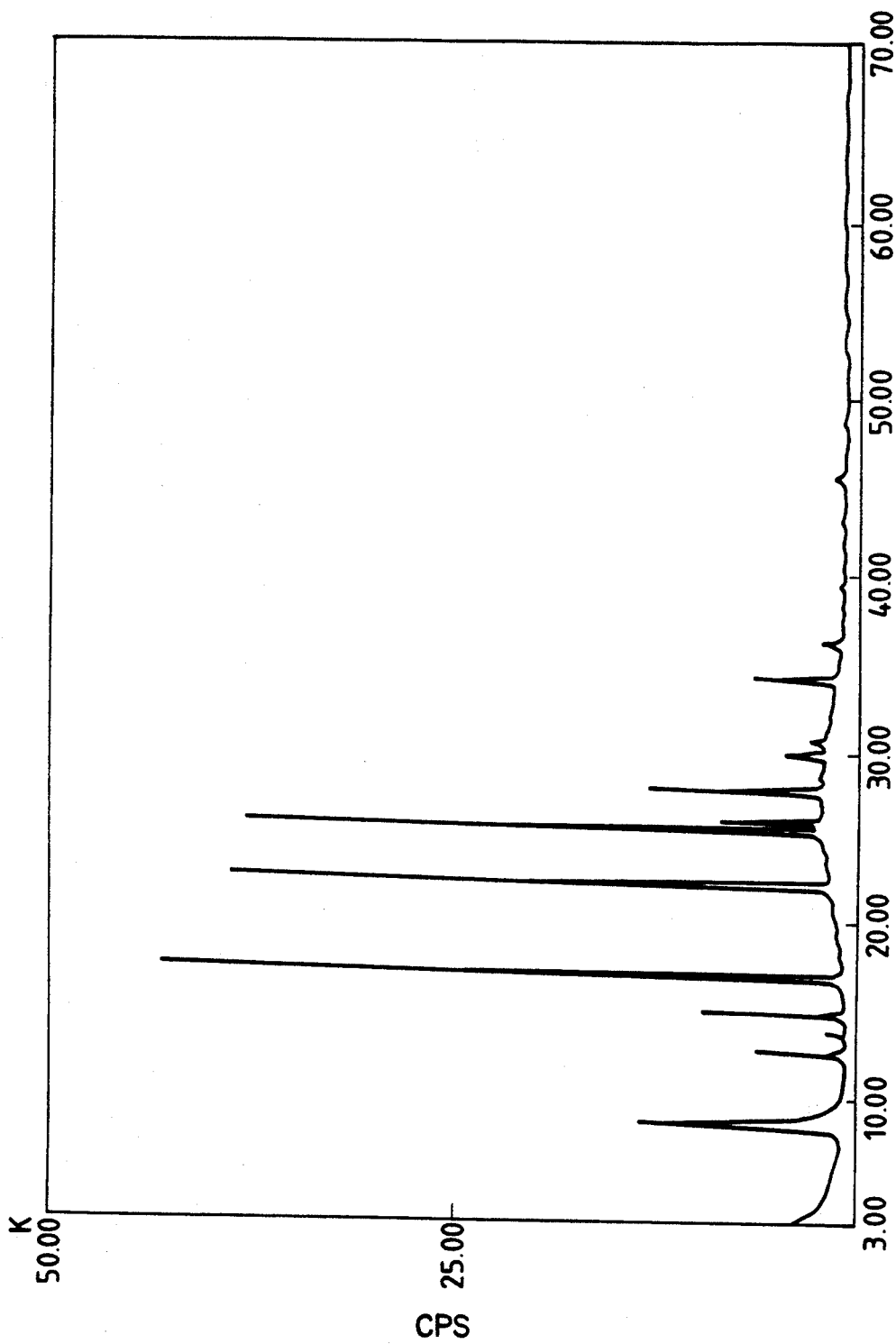
FIG. 10 is an X-ray diffraction of a BEDT-TTF film.
Figure 11:
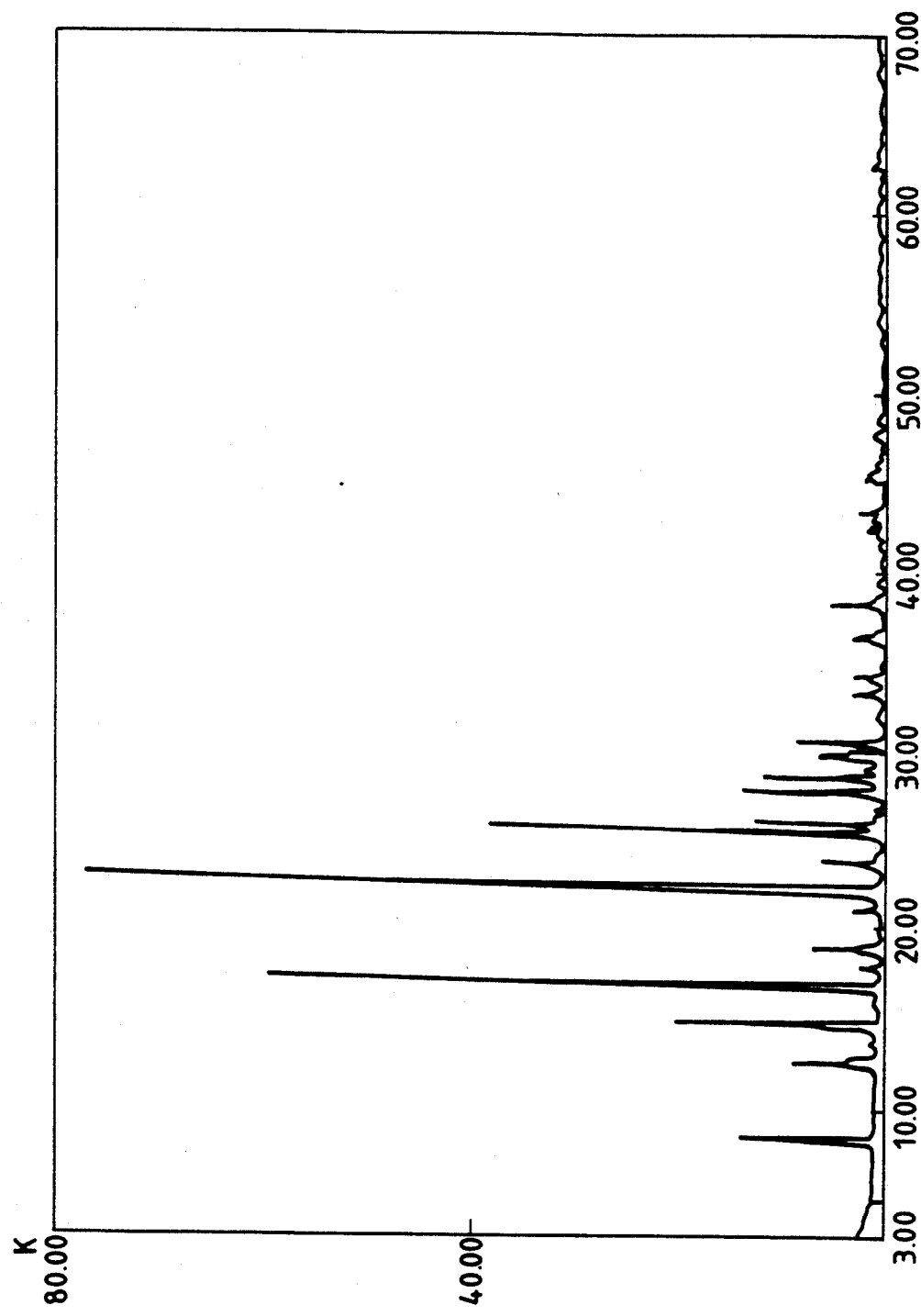
FIG. 11 is an X-ray diffraction of a starting BEDT-TTF powder.

Comparison between an X-ray diffraction of the orange-colored vapor-deposited film (FIG. 10) and that of the starting BEDT-TTF powder (FIG. 11) shows that the vapor-deposited film had an improved degree of orientation. Observations with an optical microscope and a scanning electron microscope (SEM) showed that the orange-colored vapor-deposited film was composed of agglomerated micro crystallites of BEDT-TTF and that it had good quality in terms of the absence of pinholes.

Similar experiments were conducted to prepare vapor deposited BEDT-TTF films using NESA glass or an ITO-coated polyester film as a substrate in place of the indium oxide coated glass substrate. Again, an orange-colored vapor-deposited BEDT-TTF film of good quality was obtained on each of the substrates placed at positions 1, 2 and 3 in FIG. 2.

EXAMPLE 2

A feed cell charged with 30 mg of BEDT-TTF and a substrate in the form of n-type silicon (100) wafer (resistance, 0.01–0.02Ω.cm) that measured 1×3 cm were placed in a quartz reaction tube in such a way that the distance between the feed cell and the substrate was 10 cm. The reaction tube was then set in a two-zone tubular furnace.

The quartz tube was degassed and evacuated to a pressure of $10^{-3}$ Torr and thereafter, the feed cell was heated up to 250° C. at a rate of ca. 2–3° C./min and held at 250° C. for 30 min. The temperature of the substrate was 175° C. After cooling the tubular furnace to room temperature by standing, the substrate was taken out of the furnace and found to have a light brown vapor-deposited film thereon. Similar results were obtained when a p-type silicon (100) wafer, a p-type silicon (111) wafer and an n-type silicon (111) wafer were used as substrates.

The FTIR spectrum of these thin films were in agreement with that of the starting BEDT-TTF powder, verifying the formation of the desired vapor-deposited film of BEDT-TTF without its decomposition. Observation with an optical microscope and a scanning electron microscope (SEM) showed that each of the vapor-deposited films was composed of agglomerated micro crystallites of BEDT-TTF and that they had satisfactory quality in terms of the absence of pinholes.

FIG. 4 is a SEM picture of a cross section of one of the vapor-deposited BEDT-TTF films obtained in Example 2. The lower layer (black portion) in FIG. 4 is part of the substrate and the central layer (white portion) is part of the vapor-deposited BEDT-TTF film. The white line on the right side of FIG. 4 represents a scale and its length corresponds to 10 μm. One can see from this SEM picture that the vapor-deposited film was a dense film having the major axes of the fine crystals of BEDT-TTF oriented perpendicular to the substrate surface. The thickness of this film was as 4–5 μm.

EXAMPLE 3

A vapor-deposited BEDT-TTF film was prepared as in Example 2 except that the substrate was an indium oxide coated glass plate (10×20×1 mm). FIG. 5 is a SEM picture of a cross section of the vapor-deposited BEDT-TTF film obtained in Example 3. The lower layer (black portion) in FIG. 5 is part of the substrate and the central layer (white portion) is part of the vapor-deposited BEDT-TTF film. As is clear from FIG. 5, compared to the thin films obtained in Example 2 using a silicon wafer as the substrate, the vapor-deposited BEDT-TTF film obtained in Example 3 using the indium oxide coated glass substrate was rather random in orientation and somewhat less dense in structure. The film thickness was found to be within the range of 5–7 μm.

EXAMPLE 4

As in Example 1, an $In_2O_3$ coated glass substrate was placed in a quartz reaction tube in such a way that the distance between the feed cell and the substrate was 10 cm. The reaction tube was then set in a two-zone tubular furnace.

After evacuating the reaction tube to $10^{-5}$ Torr, the feed cell was heated to 250° C. and held at that temperature for 30 min. The substrate temperature was 175° C. As a result, an orange-colored thin film could be formed on the substrate. The thickness of this film was 2-3 μm.

Using a reactor shown by 71 in FIG. 7, 70 mg of CuSCN, 125 mg of KSCN and 210 mg of 18-crown-6 were dissolved in 100 ml of ethanol in a nitrogen gas atmosphere to thereby prepare a liquid electrolyte 72. As shown in FIG. 8, the substrate 85 having the vapor-deposited BEDT-TTF film was retained with a metal clip 84 on the anode side and a dc constant current of 10 μA was allowed to flow between the two electrodes 81 and 82 in a thermostatic chamber (not shown) held at 20° C. About 10 h later, the vapor-deposited film began to turn from orange to black, indicating the occurrence of a charge transfer reaction. After a 24 hour reaction, the substrate was recovered, washed with ethanol and dried.

Figure 12:
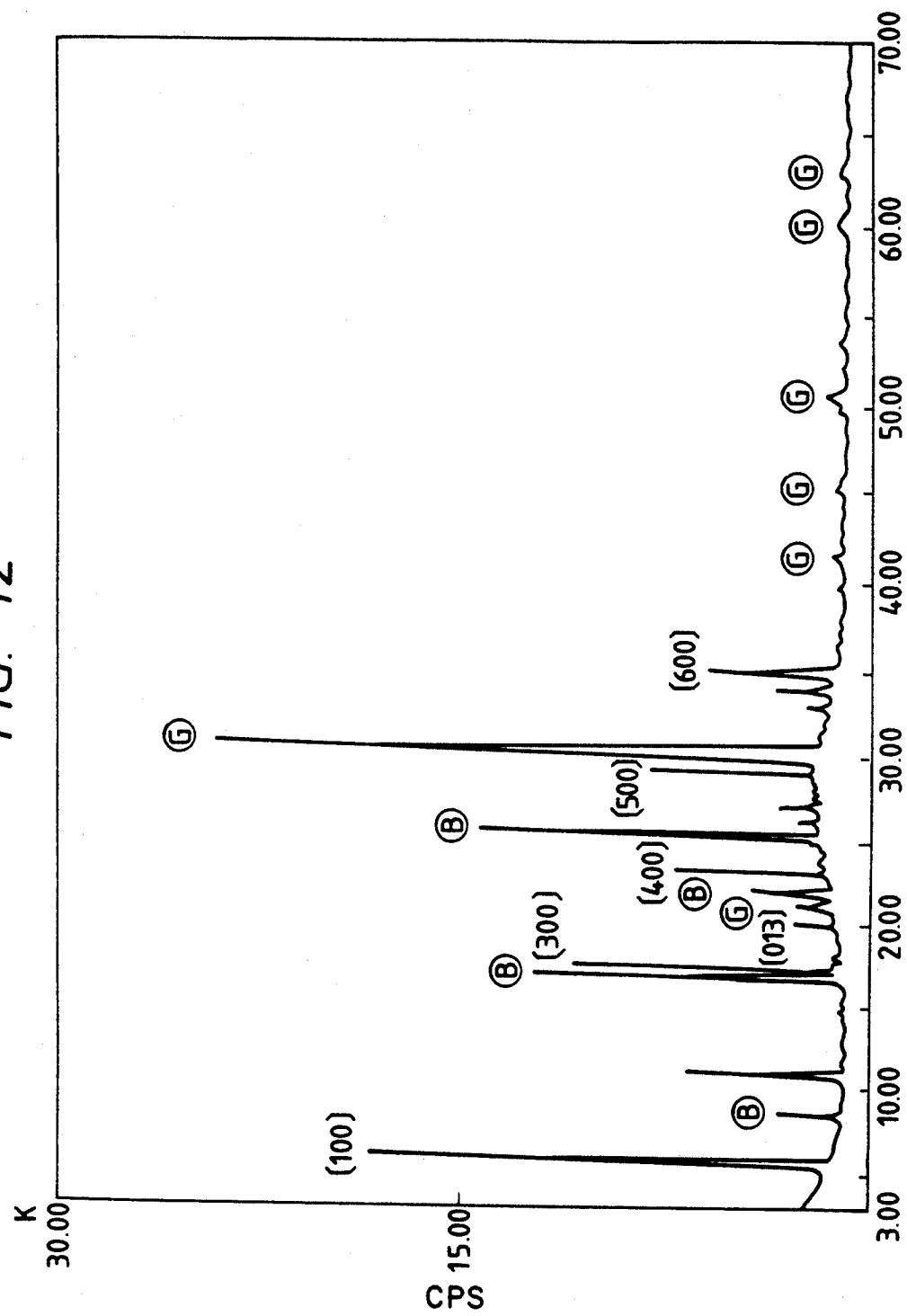
FIG. 12 is an X-ray diffraction of the X-(BEDT-TTF)$_2$Cu(NCS)$_2$ film obtained in Example 4.

An X-ray diffraction of the resulting black thin film is shown in FIG. 12, from which two kinds of peaks are identified, one assignable to κ-(BEDT-TTF)$_2$Cu(NCS)$_2$ and the other assignable to unreacted BEDT-TTF.

When the dc magnetization of the black thin film was measured, the Meissner effect was evident at 8K and this also verifies that the film was made of κ-(BEDT-TTF)$_2$Cu(NCS)$_2$. The black thin film had a conductivity of 0.1 S/cm at room temperature.

EXAMPLE 5

Figure 13:
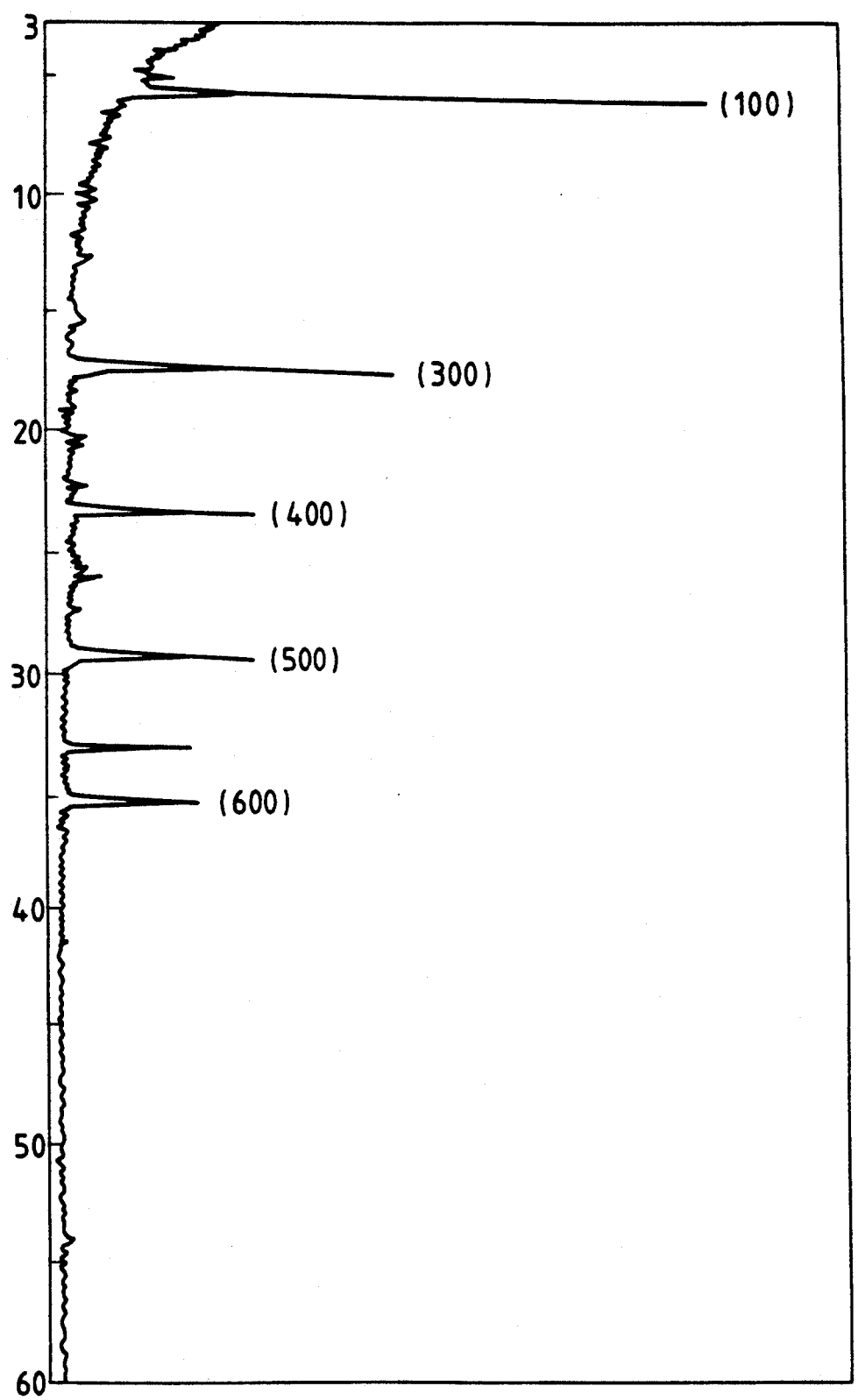
FIG. 13 is an X-ray diffraction of the X-(BEDT-TTF)$_2$Cu(NCS)$_2$ film obtained in Examples.

The highly oriented, vapor-deposited BEDT-TTF film that was prepared in Example 2 using an n-type silicon (100) wafer as a substrate was doped with an electron acceptor by an electrolytic method. As in Example 4, 70 mg of CuSCN, 126 mg of KSCN and 210 mg of 18-crown-6 were dissolved in 100 ml of ethanol in a nitrogen gas atmosphere in a reactor shown by 71 in FIG. 7, whereby a liquid electrolyte 72 was prepared. Subsequently, as shown in FIG. 8, the silicon wafer substrate 85 having the vapor-deposited BEDT-TTF film was retained with a metal clip 84 on the anode side and a dc constant current of 10 μA was allowed to flow between the two electrodes 81 and 82 in a thermostatic chamber (not shown) held at 20° C. After 5-day electrolytic doping, the substrate with the doped film was recovered, washed by dipping in ethanol and dried. An X-ray diffraction of the dried film shown in FIG. 13. exhibits distinct (h00) peaks that are only assignable to κ-(BEDT-TTF)$_2$Cu(NCS)$_2$.

When the dc magnetization of the resulting Cu(NCS)$_2^-$ doped BEDT-TTF film was measured, the Meissner effect was evident at 9K. This thin film had a conductivity of 10 S/cm at room temperature.

EXAMPLE 6

The vapor-deposited BEDT-TTF film that was prepared in Example 3 using an indium oxide coated glass substrate was doped with an electron acceptor by an electrolytic method as in Example 5 so as to form a Cu(NCS)$_2^-$ doped BEDT-TTF film on the substrate.

When the dc magnetization of the resulting Cu(NCS)$_2^-$ doped BEDT-TTF film was measured, the Meissner effect was evident at 7K. This film had a lower superconducting transition temperature (Tc) than the conductive organic thin film prepared in Example 5, which may be ascribable to the relatively low orientation and density of the vapor-deposited film. The thin film obtained in Example 6 had a conductivity of 0.1 S/cm at room temperature.

EXAMPLE 7

A silicon wafer substrate having an I$_3^-$ doped BEDT-TTF film was obtained by performing electrochemical doping as in Example 5 except that 243 mg of tetrabutyl ammonium triiodide in 100 ml of ethanol was used as an electrolyte. When the dc magnetization of resulting I$_3^-$ doped BEDT-TTF film was measured after annealing at the temperature of liquid nitrogen, the Meissner effect was evident at 8K. This film had a conductivity of 1 S/cm at room temperature.

EXAMPLE 8

As in Example 4, a vapor-deposited BEDT-TTF film was formed on an In$_2$O$_3$ coated glass substrate and the film was subsequently doped with iodine by an oxidation method. The resulting doped thin film had a conductivity of 10 S/cm at room temperature, which increased to 10$^3$ S/cm at the temperature of liquid nitrogen.

EXAMPLE 9

A vapor-deposited BEDT-TTF film was formed on a substrate as in Example 4 except that the substrate was ITO glass. Subsequently, the film was doped with iodine by electrolytic oxidation. The resulting doped film had a conductivity of 200 S/cm at room temperature which increased to 10$^4$ S/cm at the temperature of liquid nitrogen.

While the invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. An electroconductive organic thin film, comprising:
    a substrate;
    a film made of bisethylene dithiatetrathiafulvalene (BEDT-TTF) doped with an electron acceptor, vapor deposited on said substrate;
    wherein the electron acceptor is doped at a concentration so that a complex forms between BEDT-TTF and the electron acceptor, said complex having two molecules of BEDT-TTF to every one molecule of the electron acceptor; and
    wherein the film has a conductivity in a range of from 0.1 to 200 S/cm at room temperature.

2. An electroconductive organic thin film as described in claim 1, wherein the electron acceptor is at least one anion selected from the group consisting of I$_3^-$, Br$_3^-$, IBr$_2^-$, AuI$_2^-$, AuIBr$^-$, AuBr$_2^-$, Cu(NCS)$_2^-$, Ag(NCS)$_2^-$, Au(NCS)$_2^-$, Cu(NCSe)$_2^-$, Cu(NCo)$_2^-$, and Au(CN)$_2^-$.

3. An electroconductive organic thin film as described in claim 1, wherein the BEDT-TTF film is formed on a silicon substrate.

* * * * *